United States Patent

Sheng-Hsiung

[19]

[11] Patent Number: 6,159,771
[45] Date of Patent: Dec. 12, 2000

[54] METHOD OF MANUFACTURING DIODES

[75] Inventor: Hsu Sheng-Hsiung, Taipei, Taiwan

[73] Assignee: SMTEK Inc., Taipei, Taiwan

[21] Appl. No.: 09/361,520

[22] Filed: Jul. 27, 1999

[51] Int. Cl.$^7$ .................................................. H01L 21/44
[52] U.S. Cl. .............................. 438/113; 438/33; 438/106
[58] Field of Search ...................................... 438/113, 124, 438/125, 126, 127, 33, 106, 460, 464

[56] References Cited

U.S. PATENT DOCUMENTS

| | | | |
|---|---|---|---|
| 5,324,586 | 6/1994 | Ueno et al. ............................... | 257/701 |
| 5,491,111 | 2/1996 | Tai ........................................... | 438/113 |
| 5,550,086 | 8/1996 | Tai ........................................... | 438/125 |
| 5,712,197 | 1/1998 | Sanders et al. ........................... | 438/124 |
| 6,008,535 | 12/1999 | Jean et al. ................................ | 438/106 |

*Primary Examiner*—Kevin M. Picardat
*Attorney, Agent, or Firm*—A & J

[57] ABSTRACT

A method of manufacturing diodes includes steps of cutting grooves on a ceramic base to form a plurality of units, each of the grooves being formed with a vertical surface and an inclined surface, applying a layer of conductive cream all over top of each of the units except a portion close to a first edge thereof, adhering a plurality of chips on the units with one of the chips on each of the units, applying green sensing paint to the ceramic base and the chips, letting the green sensing paint to expose, developing the green sensing paint, and then removing film to uncover top of the chips and the grooves, applying a layer of conductive cream all over top of the chips except a portion close to a second edge which is opposite to the first edge, mounting a sheet of glass on top of the units and printing codes thereon, severing the ceramic base into a plurality of elongated rectangular blocks; electroplating both longer vertical sides of the elongated rectangular blocks with silver to form two opposite silver-plated sides, cutting the elongated rectangular blocks into a plurality of diodes, and electroplating an alloy of tin and lead on silver-plated sides of the diodes.

1 Claim, 2 Drawing Sheets

METHOD OF MANUFACTURING DIODES

BACKGROUND OF THE INVENTION

1. Field of the Invention

This invention is related to an improved method of manufacturing diodes.

2. Description of the Prior Art

It has been found that the conventional method for manufacturing diodes is complicated and costly thereby making it unfit for mass production and rendering it difficult to control the quality.

Therefore, it is an object of the present invention to provide an improved method of manufacturing diodes which can obviate and mitigate the above-mentioned drawbacks.

SUMMARY OF THE INVENTION

This invention is related to an improved method of manufacturing diodes.

It is the primary object of the present invention to provide a method which can produce diodes in large numbers using machinery so that each diode is the same and can be sold cheaply.

It is another object of the present invention to provide a method of manufacturing diodes which are low in cost.

It is still another object of the present invention to provide a method of manufacturing diodes which are durable in use.

According to a preferred embodiment of the present invention, a method of manufacturing diodes includes steps of cutting grooves on a ceramic base to form a plurality of units, each of the grooves being formed with a vertical surface and an inclined surface, applying a layer of conductive cream all over top of each of the units except a portion close to a first edge thereof, adhering a plurality of chips on the units with one of the chips on each of the units, applying green sensing paint to the ceramic base and the chips, letting the green sensing paint to expose, developing the green sensing paint, and then removing film to uncover top of the chips and the grooves, applying a layer of conductive cream all over top of the chips except a portion close to a second edge which is opposite to the first edge, mounting a sheet of glass on top of the units and printing codes thereon, severing the ceramic base into a plurality of elongated rectangular blocks; electroplating both longer vertical sides of the elongated rectangular blocks with silver to form two opposite silver-plated sides, cutting the elongated rectangular blocks into a plurality of diodes, and electroplating an alloy of tin and lead on silver-plated sides of the diodes.

The foregoing objects and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts. Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENT

Figure 1:
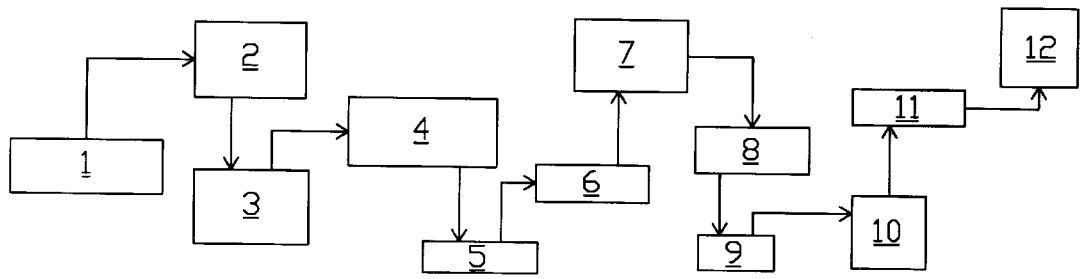
FIG. 1 is a flow chart of the present invention.

For the purpose of promoting an understanding of the principles of the invention, reference will now be made to the embodiment illustrated in the drawings. Specific language will be used to describe same. It will, nevertheless, be understood that no limitation of the scope of the invention is thereby intended, such alterations and further modifications in the illustrated device, and such further applications of the principles of the invention as illustrated herein being contemplated as would normally occur to one skilled in the art to which the invention relates.

Figure 2:
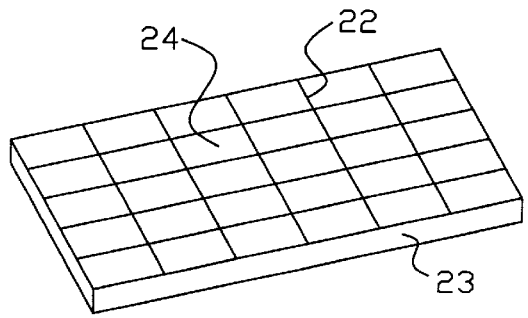
FIG. 2 is a perspective view of the ceramic base formed with a plurality of grooves thereon.
Figure 2A:
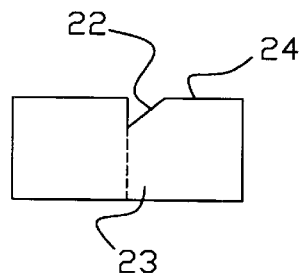
FIG. 2A illustrates the shape of the groove on ceramic base.

With reference to the drawings and in particular FIGS. 1 and 2 thereof, the method of manufacturing diodes comprises the steps of:

1. cutting grooves 22 on a ceramic base 23 to form a plurality of units 24;
2. applying a layer of conductive cream 25 all over the top of each of the units 24 except a portion close to the right edge thereof (with respect to FIG. 4) to form a first electrode;
3. adhering a plurality of chips 26 on the units 24 with one chip 16 on a respective one of the units 24;
4. applying green sensing paint 28 to the ceramic base 23 and the chips 26 (see FIG. 5), letting the green sensing paint 28 to expose, developing the green sensing paint 28, and then removing the film to uncover the top 29 of each chip 26 and the grooves 22 (see FIG. 6);
5. applying a layer of conductive cream 25 all over the top of the chips 26 except a portion close to the left edge thereof(see FIG. 7) to form a second electrode;
6. mounting a sheet of glass 31 on the top of the units 24 and printing codes thereon corresponding to the units 24;
7. severing the ceramic base 23 into a plurality of elongated rectangular blocks 16;
8. electroplating both longer vertical sides of the elongated rectangular block 16 with silver to form two opposite silver-plated sides;
9. cutting the elongated rectangular block 16 into a plurality of diodes 34;

10. electroplating an alloy of tin and lead on the silver-plated sides of the diodes 34;

11. testing the diodes 34; and 12. packaging the diodes 34.

Referring to FIG. 2, the V-shaped groove 22 is formed with a vertical surface and an inclined surface so that when the unit 24 is severed along the V-shaped groove 22, the unit 24 will be formed with a chamfer for strengthening the attachment of the silver 33 to the diode 34.

Figure 3:
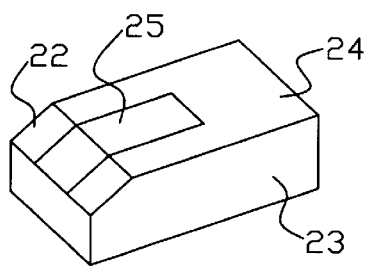
FIG. 3 illustrates how a layer of conductive cream is applied to the unit.

As shown in FIG. 3, each of the unit 24 on the ceramic base 23 is coated with a layer of conductive cream 25 or electroplated with a conductor (not shown).

Figure 4:
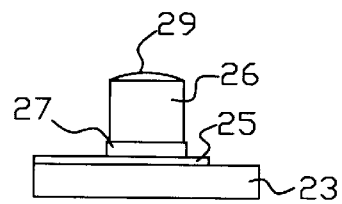
FIG. 4 illustrates the attachment of a chip to the top of the ceramic base.

Referring to FIG. 4, the chip 26 is adhered on the ceramic base 23 by conductive adhesive agent 27 or the like.

Figure 5:
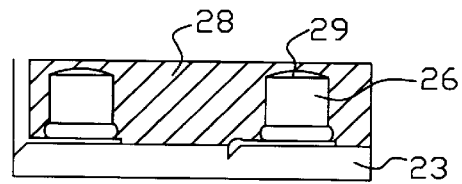
FIG. 5 is a sectional view illustrating how the chip is coated with green sensing paint.
Figure 6:
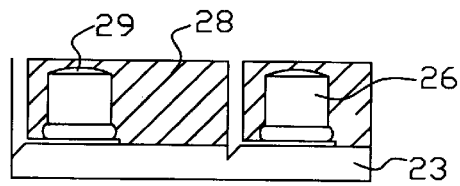
FIG. 6 illustrates how the film is removed to uncover the top of the chip and the groove.

FIG. 5 illustrates the application of green sensing paint 28 on the ceramic base 23 and the chip 26. FIG. 6 illustrates the processing of the green sensing paint 28. As shown, the green sensing paint 28 is first applied to the ceramic base 23 and the chip 26 and then the film is removed after exposure and development so as to uncover the top 29 of the chip 26 and the groove 22.

Figure 7:
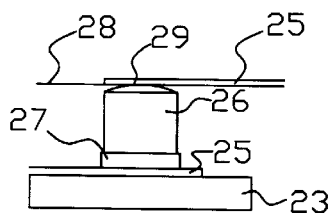
FIG. 7 illustrates how a layer of conductive cream is applied to the top of the chip.

Referring to FIG. 7, a layer of conductive cream 5 is applied to all over the top of the chip 26 except the portion close to left edge (with respect to FIG. 7) thereby forming an electrode of the diode.

Figure 8:
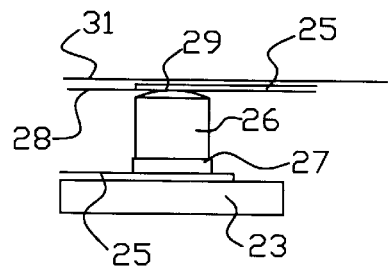
FIG. 8 illustrates mounting a sheet of glass on the top of the units and printing a code on each of the units.

Referring to FIG. 8, a sheet of glass 31 is mounted on the chips 26 and a code is printed on the top of each of the chips 26.

Figure 9:
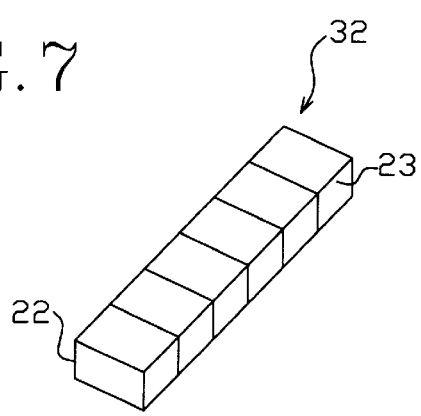
FIG. 9 is a perspective view of the elongated rectangular block.

Referring to FIG. 9, the ceramic base 23 is severed into a plurality of elongated rectangular blocks 32.

Figure 10:
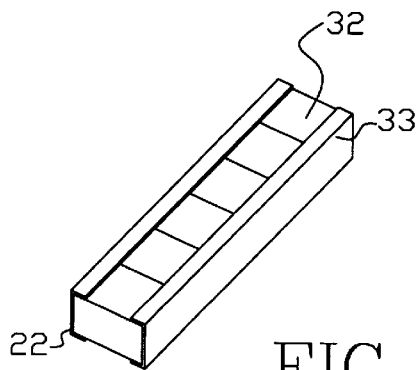
FIG. 10 illustrates how the elongated rectangular block is electroplated with silver.

Referring to FIG. 10, the elongated rectangular block 32 is electroplated with silver at two longer vertical sides to form two silver-plated sides of the diodes 34.

Figure 11:
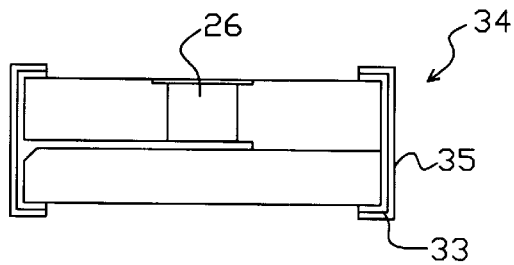
FIG. 11 illustrates the structure of a diode constructed according to the present invention.

Referring to FIG. 11, an alloy of tin-lead is electroplated on the silver-plated sides of the diodes 34.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A method of manufacturing diodes comprising steps of:

a. cutting grooves on a ceramic base to form a plurality of units, each of said grooves being formed with a vertical surface and an inclined surface;

b. applying a layer of conductive cream all over top of each of said units except a portion close to a first edge thereof to form a first electrode;

c. adhering a plurality of chips on said units with one of said chips on each of said units;

d. applying green sensing paint to said ceramic base and said chips, letting said green sensing paint to expose, developing said green sensing paint, and then removing film to uncover top of said chips and said grooves;

e. applying a layer of conductive cream all over top of said chips except a portion close to a second edge which is opposite to said first edge to form a second electrode;

f. mounting a sheet of glass on top of said units and printing codes thereon;

g. severing said ceramic base into a plurality of elongated rectangular blocks;

h. electroplating both longer vertical sides of said elongated rectangular blocks with silver to form two opposite silver-plated sides;

i. cutting said elongated rectangular blocks into a plurality of diodes; and j. electroplating an alloy of tin and lead on silver-plated sides of said diodes.

* * * * *